United States Patent
Ono et al.

(10) Patent No.: US 7,034,441 B2
(45) Date of Patent: Apr. 25, 2006

(54) SURFACE MOUNT CRYSTAL UNIT AND SURFACE MOUNT CRYSTAL OSCILLATOR

(75) Inventors: Kozo Ono, Saitama (JP); Akio Chiba, Saitama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 10/706,517

(22) Filed: Nov. 12, 2003

(65) Prior Publication Data

US 2004/0095199 A1  May 20, 2004

(30) Foreign Application Priority Data

| Nov. 13, 2002 | (JP) | ............................. 2002-330006 |
| Nov. 25, 2002 | (JP) | ............................. 2002-340654 |
| Nov. 27, 2002 | (JP) | ............................. 2002-343575 |
| Dec. 10, 2002 | (JP) | ............................. 2002-358664 |

(51) Int. Cl.
*H01L 41/08* (2006.01)

(52) U.S. Cl. ...................... 310/344; 310/348
(58) Field of Classification Search ................ 310/344, 310/346, 348, 351–356
See application file for complete search history.

(56) References Cited

U.S. PATENT DOCUMENTS

| 4,270,105 A | * | 5/1981 | Parker et al. ................ 333/155 |
| 4,639,631 A | * | 1/1987 | Chason et al. .............. 310/344 |
| 5,448,126 A | * | 9/1995 | Eda et al. ................ 310/313 A |
| 5,747,857 A | * | 5/1998 | Eda et al. .................... 257/416 |
| 5,801,474 A | * | 9/1998 | Sakairi ................... 310/313 R |
| 5,952,894 A | * | 9/1999 | Fukiharu .................... 331/176 |
| 6,018,211 A | * | 1/2000 | Kanaboshi et al. ..... 310/313 R |

* cited by examiner

*Primary Examiner*—Mark Budd
(74) *Attorney, Agent, or Firm*—Katten Muchin Roseman LLP

(57) ABSTRACT

A surface mount crystal unit comprising a crystal blank, a planar mounting substrate made of silicon and a cover having a shape with a recess and made of glass containing ions having high mobility. The mounting substrate and the cover are bonded by means of anode bonding and the crystal blank is hermetically sealed in a case made up of the mounting substrate and the cover. The mounting substrate has connection electrodes used for a connection with the crystal blank and external terminals to be used to surface-mount the crystal unit. The connection electrodes and external terminals are electrically connected.

15 Claims, 11 Drawing Sheets

SURFACE MOUNT CRYSTAL UNIT AND SURFACE MOUNT CRYSTAL OSCILLATOR

BACKGROUND OF THE INVENTION

1. Field of the Invention

The present invention relates to a quartz crystal unit and quartz crystal oscillator for surface mounting, and more particularly, to a surface mount crystal unit and surface mount crystal oscillator which can realize the further miniaturization thereof.

2. Description of the Related Art

A surface mount crystal unit is widely used for an oscillator and the like as a reference source of frequency or time, especially in portable electronic devices since it is small and light. Furthermore, among crystal oscillators having a crystal unit and an oscillation circuit using the crystal unit that are integrated into a single member, a surface mount crystal oscillator is used widely as a reference source of frequency or time, especially in portable electronic devices since it is small and light. As miniaturization of devices incorporating a crystal unit or crystal oscillator advances, there is a demand for a smaller surface mount crystal unit or smaller surface mount crystal oscillator.

FIGS. 1A and 1B illustrate an example of a configuration of a conventional surface mount crystal unit. Here, the member equivalent to a substrate in a surface mounting package is called a mounting substrate. In the surface mount crystal unit illustrated here, quartz crystal blank 2 is accommodated in a casing as mounting substrate 1, the opening of the casing is covered with cover 3 and crystal blank 2 is thereby hermetically sealed in the casing. In order to form a recess to accommodate crystal blank 2, the casing, that is, mounting substrate 1 consists of substantially square-shaped bottom wall 4 and frame-shaped frame wall 5 having a size conforming to bottom wall 4. That is, the casing consists of laminated ceramics with frame wall 5 placed on bottom wall 4. On the outer surface of the casing, external terminals 6 are provided which are used to surface-mount this crystal unit on an external wiring board or the like. Furthermore, on the inner bottom surface of the casing, a pair of connection electrodes 7 is provided which is used for a connection with crystal blank 2. Connection electrodes 7 are electrically connected to external terminals 6 through the interface between bottom wall 4 and frame wall 5 in the casing and the end face of the casing.

As crystal blank 2, as shown in FIG. 2, an AT-cut quartz crystal blank having a square planar shape is used. Excitation electrodes 8 are formed on both principal surfaces of crystal blank 2 and extension electrodes 9 are extended from excitation electrodes 8 toward opposite sides at one end of crystal blank 2. The opposite sides of one end of crystal blank 2 to which extension electrodes 9 are extended are bonded to connection electrodes 7 with a conductive adhesive, crystal blank 2 is thus held in the recess of the casing horizontally and electrically and mechanically connected to the casing.

Cover 3 is made of, for example, metal and is bonded to a metal ring or metal film (not shown) provided on the upper surface of frame wall 5 by seam welding or beam welding to close the recess of the casing and hermetically seal crystal blank 2 in this recess.

However, mounting substrate 1 in the surface mount crystal unit in the above described configuration consists of laminated ceramics, and therefore frame wall 5 is required to have a thickness of a certain value or greater for convenience of manufacturing steps such as lamination and baking of the ceramic green sheet in the manufacturing process of mounting substrate 1. Here, the thickness refers to a distance between the outer surface and the inner surface of frame wall 5. A large thickness of frame wall 5 lessens the area of the inner bottom face of the casing.

On the other hand, as the surface area becomes greater, crystal blank 2 displays a better vibration characteristic. Furthermore, when it is assumed that an equivalent parallel capacitance of the crystal blank, that is, a capacitance between the excitation electrodes is $C_0$ and an equivalent serial capacitance is $C_1$, it is possible to increase the degree of freedom of design and facilitate the design of the crystal unit by increasing the surface area of the crystal blank, for example, by reducing capacitance ratio $C_0/C_1$. Therefore, in order to reduce the size of the crystal unit, it is necessary to reduce external dimensions of mounting substrate 1 which constitutes the casing and at the same time maintain or increase the area of the inner bottom face of the casing.

FIGS. 3A and 3B show another example of a conventional crystal unit for surface mounting. In the crystal unit shown here, planar mounting substrate 1 and cover 3 having a recessed shape are used, the side with the opening of cover 3 is fixed to mounting substrate 1 using sealing member 10 made of glass or resin to hermetically seal crystal blank 2 in a space made up of mounting substrate 1 and the recess of cover 3. Cover 3 is made of ceramics.

In the crystal unit shown in FIGS. 3A and 3B, cover 3 can be fabricated by integral molding, and therefore it is possible to reduce the thickness of cover 3 and increase the area of the inner bottom face of the casing. However, when glass is used as sealing member 10, since glass for the sealing member is glass with a low melting point which has small mechanical resistance, there is a drawback in the shock resistance characteristic of the crystal unit. When resin is used as sealing member 10, there is a danger that ambient air with humidity may enter the inner space of the casing and reduce the vibration characteristic of the crystal unit.

Various problems of the conventional surface mount crystal unit also apply to a surface mount crystal oscillator in the same way.

FIG. 4 shows an example of a configuration of a surface mount crystal oscillator which integrates a crystal blank which serves as a crystal unit with an oscillation circuit using this crystal blank. The surface mount crystal oscillator comprises mounting substrate 11, IC (integrated circuit) chip 12 incorporating an oscillation circuit, crystal blank 2 and cover 14. Mounting substrate 11 includes a recess and steps formed on the inner wall of the recess and is made of laminated ceramics. More specifically, mounting substrate 11 consists of substantially square bottom wall 15, rectangle-shaped first frame wall 16a and second frame wall 16b having a smaller thickness than first frame wall 16a laminated one atop another. Because of the difference in thickness between first frame wall 16a and second frame wall 16b, the steps are formed inside the recess of mounting substrate 11. IC connection terminals (not shown) used for a connection with IC chip 12 are provided on the bottom face of the recess and connection electrodes to be used for a connection with crystal blank 2 are provided on the top surface of the step. External terminals 6 to be used for surface-mounting this crystal oscillator on an external wiring board are provided on the outer bottom face of mounting substrate 11. The connection electrodes and IC connection terminals are electrically connected through conductive paths provided on mounting substrate 11 and the IC connection terminals and external terminals 6 are also electrically connected.

IC chip 12 comprises the integrated oscillation circuit as described above and includes IC terminals (not shown) including at least a power terminal, output terminal and grounding terminal on its one principal surface. By bonding these IC terminals to the IC connection terminals on mounting substrate 11 by means of ultrasonic thermo-compression bonding or thermo-compression bonding using bumps 18, the IC chip 12 is electrically and mechanically connected to mounting substrate 11.

As crystal blank 2, the same one shown in FIG. 2 is used and crystal blank 2 is electrically and mechanically connected to mounting substrate 11 by boding the opposite sides of one end of crystal blank 2 to which extension electrodes are extended onto the connection electrodes on the step In the recess using conductive adhesive 17.

Such a surface mount crystal oscillator uses four components of mounting substrate 11, IC chip 12, crystal blank 2 and cover 3, and therefore it is difficult to further drastically reduce the size. Furthermore, in the above example, IC chip 12 and crystal blank 2 are placed in their thickness directions, resulting in a problem of increasing especially the height of the surface mount element.

Furthermore, as in the case of the above described surface mount crystal unit, it is necessary to set the thicknesses of first frame wall 16a and second frame wall 16b to a certain value or greater, for example, the approximately same height as the frame wall, and therefore it is not possible to sufficiently increase the area of the inner bottom face in the case. Thus, when the external size of the surface mount crystal oscillator is further reduced, it is difficult to obtain a good vibration characteristic for crystal blank 2 and also difficult to design crystal blank 2 as the crystal unit.

SUMMARY OF THE INVENTION

It is an object of the present invention to provide a surface mount crystal unit which allows further miniaturization, has a good vibration characteristic and facilitates design.

It is another object of the present invention to provide a surface mount crystal oscillator which allows further miniaturization and can especially reduce its height.

It is a further object of the present invention to provide a surface mount crystal oscillator whose crystal blank has a good vibration characteristic and which can be designed easily.

The first object of the present invention can be attained by a surface mount crystal unit comprising a crystal blank, a planar mounting substrate made of silicon and a cover having a shape including a recess, made of glass containing ions having high mobility, wherein the mounting substrate and cover are bonded by means of anode bonding, the crystal blank is hermetically sealed in a case made up of the mounting substrate and cover and the mounting substrate has connection electrodes used to connect the crystal blank.

The second object of the present invention can be attained by a surface mount crystal oscillator comprising a crystal blank, a planar mounting substrate made of silicon which integrates an oscillation circuit using the crystal blank and a cover having a shape including a recess and made of glass containing ions having high mobility, wherein the mounting substrate and cover are bonded by means of anode bonding and the crystal blank is hermetically sealed in a case made up of the mounting substrate and cover.

DETAILED DESCRIPTION OF THE INVENTION

Figure 1A:
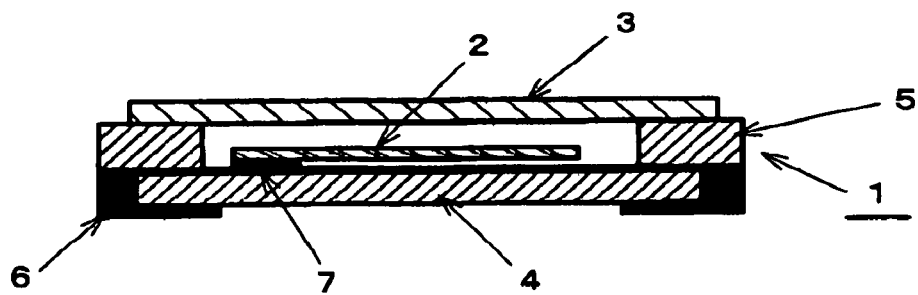
FIG. 1A is a sectional view showing an example of a conventional surface mount crystal unit.
Figure 1B:
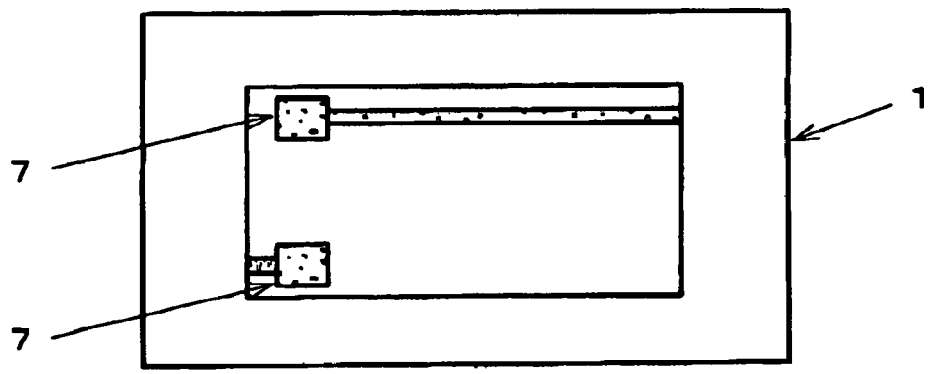
FIG. 1B is a plan view of the crystal unit shown in FIG. 1A with the cover and crystal blank removed.
Figure 2:
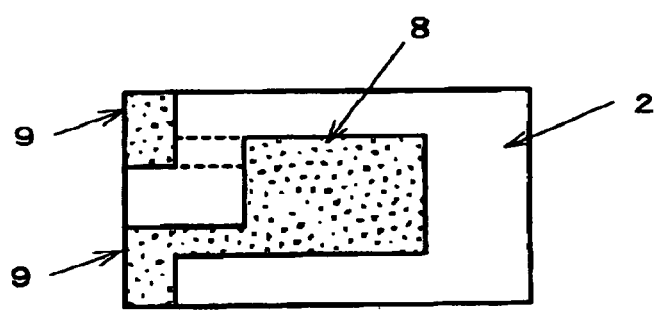
FIG. 2 is a plan view showing an example of the crystal blank.
Figure 3A:
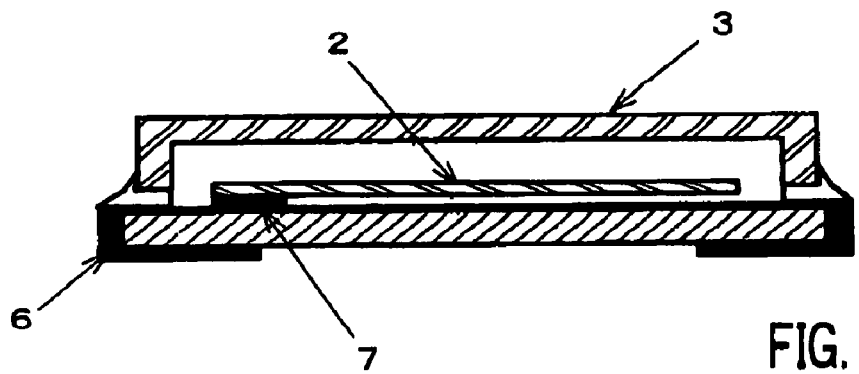
FIG. 3A is a sectional view showing another example of the conventional surface mount crystal unit.
Figure 3B:
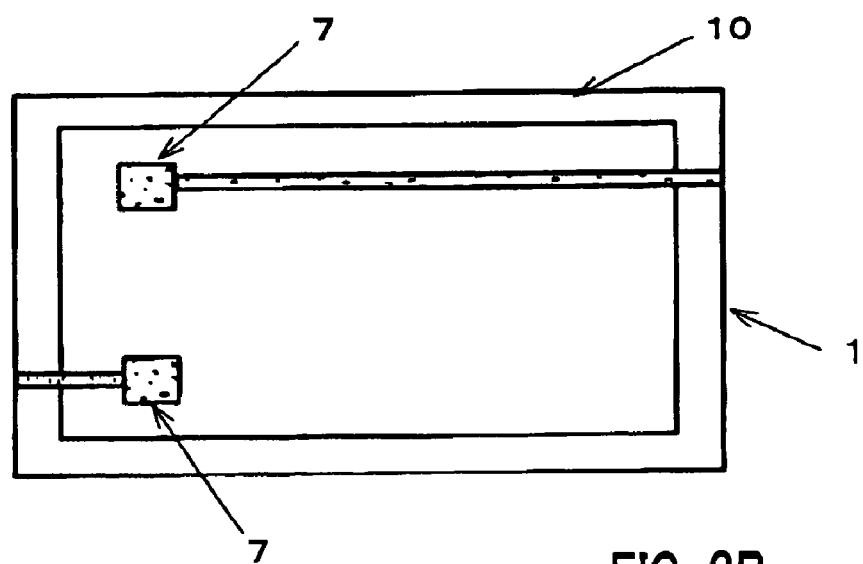
FIG. 3B is a plan view of the crystal unit shown in FIG. 3A with the cover and crystal blank removed.
Figure 4:
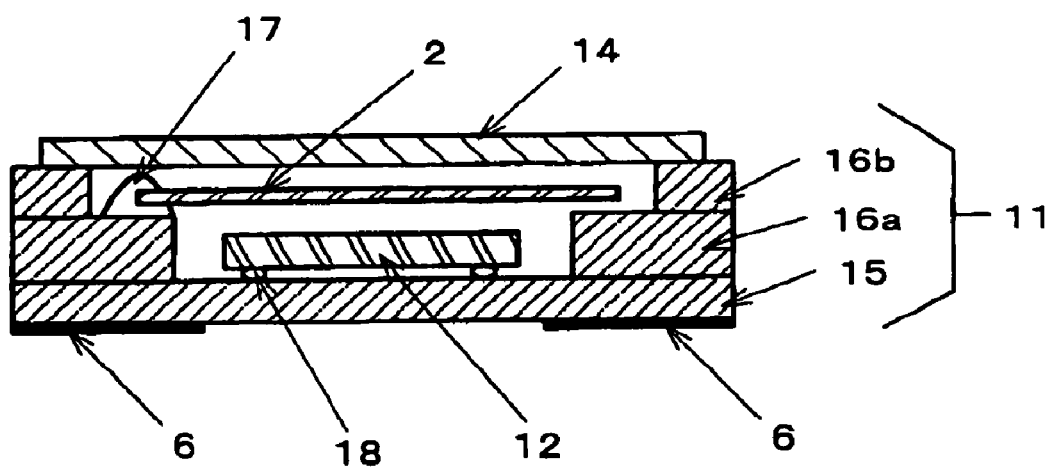
FIG. 4 is a sectional view showing a conventional surface mount crystal oscillator.
Figure 5A:
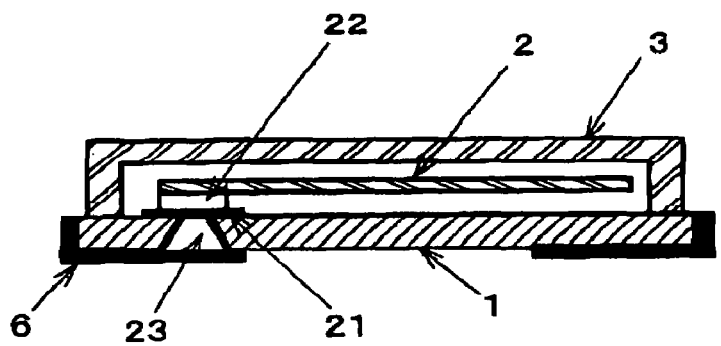
FIG. 5A is a sectional view showing a surface mount crystal unit according to a first embodiment of the present invention.
Figure 5B:
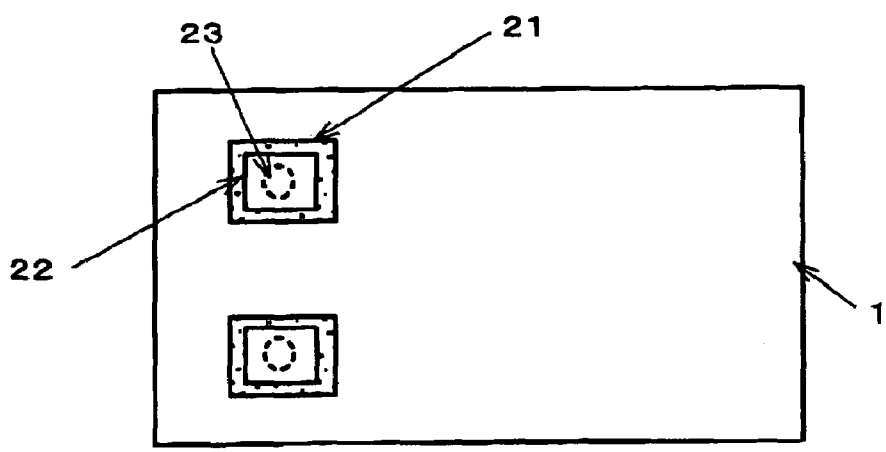
FIG. 5B is a plan view of the crystal unit shown in FIG. 5A with the cover and crystal blank removed.
Figure 5C:
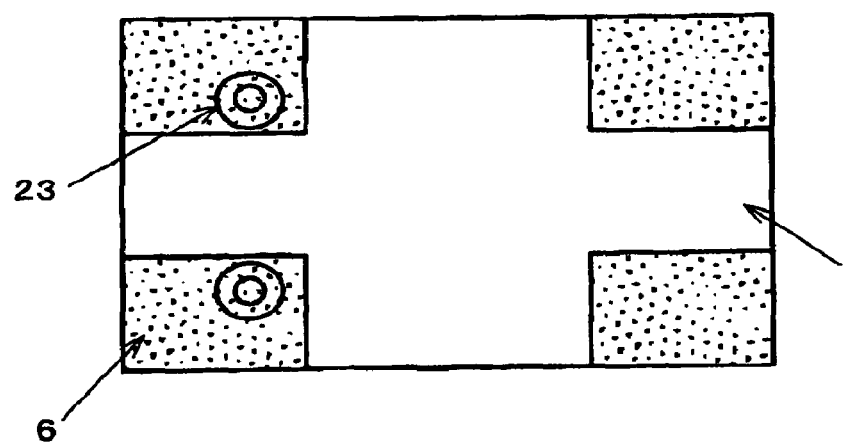
FIG. 5C is a bottom view of the crystal unit shown in FIG. 5A.

The surface mount quartz crystal unit according to the first embodiment of the present invention shown in FIGS. 5A to 5C comprises quartz crystal blank 2 hermetically sealed in a case made up of substantially square planar mounting substrate 1 and cover 3 having a shape with a recess. As crystal blank 2, the one described in FIG. 2 is used.

Mounting substrate 1 is made up of a silicon (SI) substrate. Two metal films 21 are provided close to one short side on the surface of mounting substrate 1. The direction of the line connecting the two metal films 21 is parallel to the direction in which the short side of mounting substrate 1 extends. A small piece of metal plate 22 is bonded to each metal film 21 by means of silver solder or the like. Metal plates 22 are arranged on the positions which correspond to opposite sides of one end crystal blank to extension electrodes are extended. Crystal blank 2 is electrically and mechanically connected to mounting substrate 1 by connecting opposite sides of one end of crystal blank 2 to metal plate 22. Metal plate 22 functions as connection electrodes to connect the crystal blank.

Through-holes 23 are formed by etching from the back of substrate 1, that is, the outer surface of the crystal unit to metal plates 22 at the positions at which metal plates 22 are provided. Since etching is applied from the back of the substrate, the cross section of each through-hole 23 has a tapering shape which becomes narrower toward metal plate 22. A conductive layer for electrically connecting metal film 21 and metal plate 22 is formed on the inner surface of each through-hole 23, which allows through-hole 23 to function as an electrode through-hole. On the outer surface of substrate 1, the conductive layer of each through-hole 23 is formed in such a way as to also spread toward the area peripheral to through-hole 23, and in this way constitutes external terminal 6. External terminals 6 are terminals used to surface-mount the surface mount crystal unit on an external wiring board or the like, and extends to the vicinity of the corresponding vertices of the outer bottom face of mounting substrate 1. Dummy external terminals 6 are also formed along the short side of the short sides of mounting substrate 1 where no through-holes are provided.

The conductive layer formed on the inner wall of through-holes 22 and external terminals 6 are provided by, for example, forming a chromium (Cr) layer as a base electrode and laminating a copper (Cu) layer and gold (Au) layer by means of vacuum deposition.

In this embodiment, as cover 3, glass is used which has a linear thermal expansion coefficient equivalent to that of silicon used for mounting substrate 1 and contains ions having high mobility such as sodium ($Na^+$) ions or lithium ($Li^+$) ions. As such glass, for example, Pyrex® which is borosilicate glass and Devitron® which is crystallized glass can be used.

In this embodiment, cover 3 is bonded to substrate 1 using an anode bonding method. Here, suppose cover 3 is made of borosilicate glass and $Na^+$ ions move during anode bonding.

First, the respective bonded surfaces of mounting substrate 1 and cover 3 are polished to a mirror-finished surface, the opening side of cover 3 is placed on the outer surface of mounting substrate 1 and while heating them to approximately 300 to 400° C., a voltage of approximately 500 V is applied to them in such a way that cover 3 becomes negative and mounting substrate 1 becomes positive. As a result, $Na^+$ ions included in cover 3 which are ions with high mobility are moved by the applied electric field, a $Na^+$ ion-depletion layer is formed in an interface with mounting substrate 1 made of silicon, a great electrostatic attracting force is produced and both are bonded together strongly. Furthermore, the cover 3 side is running short of $Na^+$ ions, non-cross-linked oxygen ions in the glass making up cover 3 are covalent-bonded with silicon atoms included in substrate 1 and the two are bonded by chemical bonding, which drastically increases the bonding strength between mounting substrate 1 and cover 3.

In this embodiment, it is possible to keep sufficient bonding strength between the mounting substrate and cover using the planar mounting substrate and thereby increase the area of the inner bottom surface of the case which accommodates the crystal blank though the external size is the same compared to a conventional crystal unit using a mounting substrate having a recess. Therefore, according to this embodiment, it is possible to use a large crystal blank, obtain a good vibration characteristic and improve the degree of freedom of design. Furthermore, compared with a crystal unit with a cover having a recess fixed using a sealing member made of glass or resin to a planar mounting substrate, use of anode bonding can improve shock resistance and reliably prevent ambient air from entering the case.

Conventionally, when glass is used as a sealing member, glass with a low melting point is used, which causes shock resistance to decrease. On the other hand, the cover used in this embodiment can be formed of glass with a high melting point. Using the glass with a high melting point increases bonding strength of the bonded part and improves shock resistance.

The above described surface mount crystal unit is manufactured by providing metal films 21 on the surface of mounting substrate 1, bonding metal plate 22 thereto and then forming through-holes 23 from the back of mounting substrate 1 by etching, which assures the airtightness as the case. However, this embodiment is not limited to this, but it is also possible to provide, for example, through-holes 23 in mounting substrate 1 by etching, provide metal films 21 on both surfaces of the mounting substrate including through-holes 23 and bond metal plate 22 thereto.

The method of bonding metal plate 22 is not limited to silver solder. It is also possible, for example, to form a thick metal layer on the surface of mounting substrate 1 and apply etching to the back of mounting substrate 1 to form through-holes 23. What is important is to provide a metal body including bumps, etc., as an etching stopper and lead electrodes from this metal body through through-holes 23.

The configuration using a metal body as the connection electrodes used for a connection with the crystal blank, providing an electrode through-body which penetrates the mounting substrate below this metal body and electrically connect the metal body and external terminal through the electrode through-body is also applicable to a case where the method of connecting the cover and mounting substrate is other than the anode bonding method.

Figure 6:
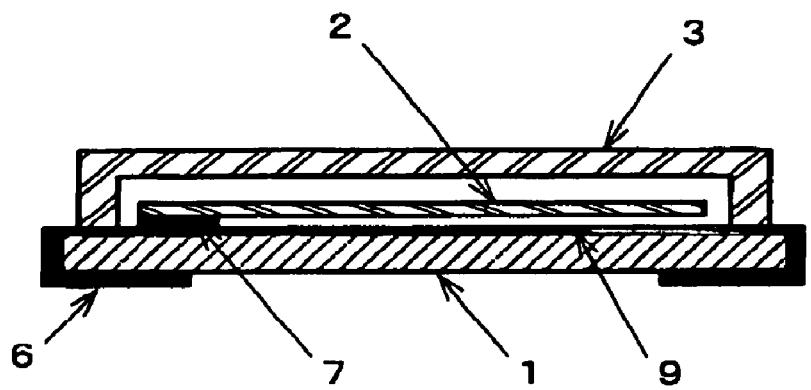
FIG. 6 is a sectional view showing another example of the surface mount crystal unit according to the first embodiment.

The crystal unit shown in FIGS. 5A to 5C establishes an electrical connection between crystal blank 2 and external terminals 6 by means of metal plates 22 and through-holes 23 provided in mounting substrate 1 while keeping airtightness, but it is a known fact that anode bonding can maintain airtightness even by inserting a thin aluminum electrode layer in the bonding interface so as to traverse the bonding surface, and therefore it is also possible to provide a thin aluminum electrode layers instead of providing through-holes 23 and thereby establish an electrical connection between the connection electrodes and external terminals 6 used for a connection with crystal blank 2. FIG. 6 shows a surface mount crystal unit in which the connection electrodes and external terminals 6 are electrically connected through aluminum electrode layers 9. Here, connection electrodes 7 are provided on the surface of mounting substrate 1 instead of metal plates 22.

The material of cover 3 is not limited to the above described borosilicate glass or crystallized glass. Any appropriate material can be used if it at least includes ions such as Na$^+$ ions and Li$^+$ ions and allows these ions to easily move by an electric field in a solid phase.

Figure 7:
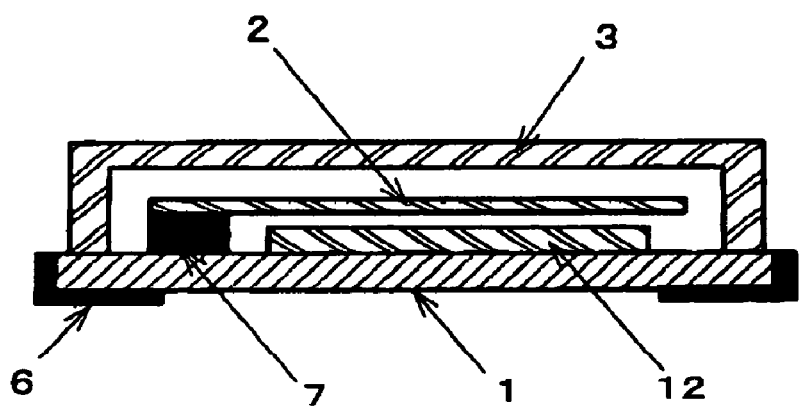
FIG. 7 is a sectional view showing a surface mount crystal oscillator combining the crystal unit according to the first embodiment and an IC chip.

The above described surface mount crystal unit can be constructed as a surface mount crystal oscillator by incorporating an IC chip in the case. FIG. 7 shows such a surface mount crystal oscillator. This surface mount crystal oscillator uses relatively high connection electrodes 7 and places IC chip 12 on the surface of mounting substrate 1 below crystal blank 2. Though not shown here, connection electrodes 7 and IC chip 12 are electrically connected. External terminals 6 are electrically connected to a power terminal of the IC chip, output terminal and grounding terminal, etc., respectively.

Figure 8A:
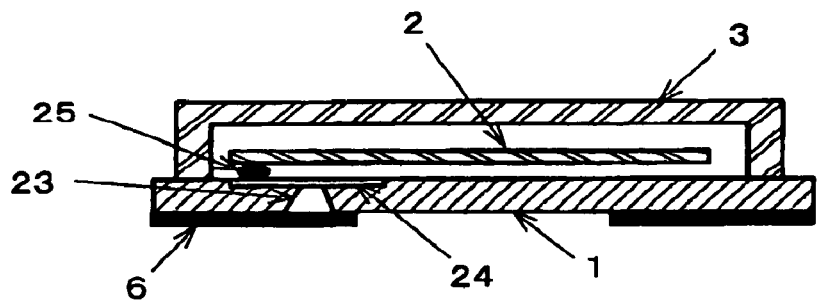
FIG. 8A is a sectional view showing a surface mount crystal unit according to a second embodiment of the present invention.
Figure 8B:
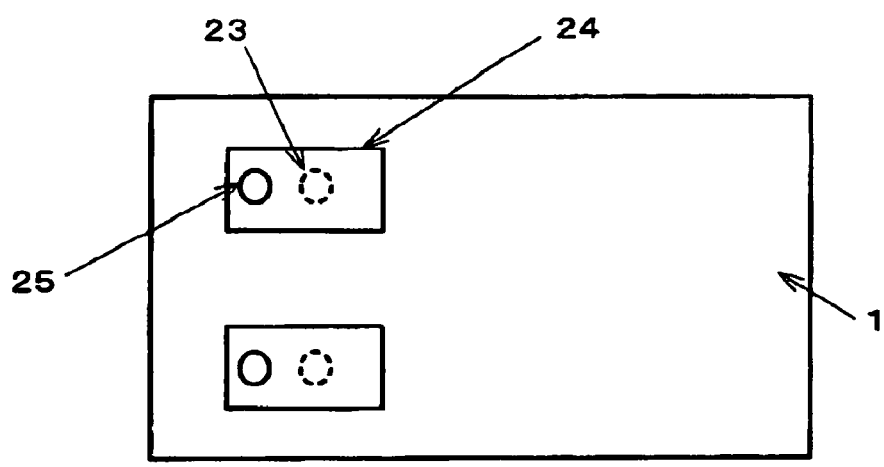
FIG. 8B is a plan view of the crystal unit shown in FIG. 8A with the cover and crystal blank removed.
Figure 8C:
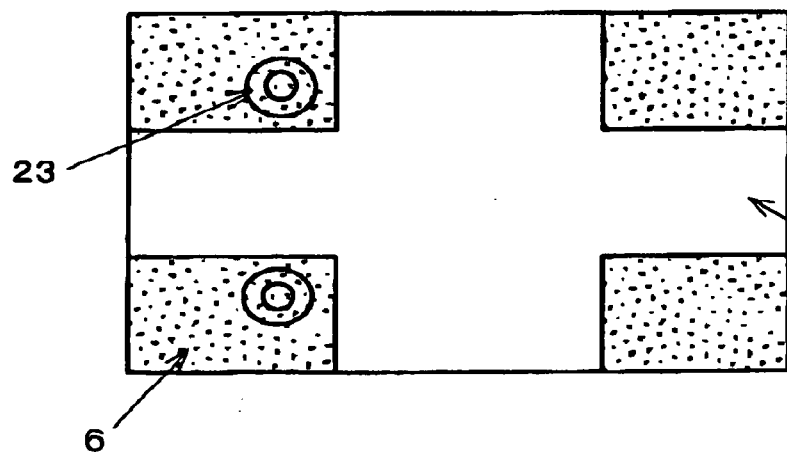
FIG. 8C is a bottom view of the crystal unit shown in FIG. 8A.

Then, a surface mount crystal unit according to a second embodiment of the present invention will be explained. The surface mount crystal unit according to the second embodiment shown in FIGS. 8A to 8C comprises crystal blank 2 hermetically sealed in a case made up of substantially square planar mounting substrate 1 and cover 3 having a shape with a recess. As crystal blank 2, the same crystal blank shown in FIG. 2 is used. As cover 3, the same cover used in the first embodiment is used.

Polycrystalline-silicon layers 24 are formed at two positions on one short side of mounting substrate 1 made of single-crystalline silicon. The positions where polycrystalline-silicon layers 24 are formed correspond to the positions on the opposite sides of one end to which excitation electrodes 10 of crystal blank 2 are extended. Polycrystalline-silicon layer 24 constitutes a p-type layer in which, for example, highly concentrated boron (B) is doped. Two polycrystalline-silicon layers 24 are placed in the direction parallel to the direction in which the short side of mounting substrate 1 extends. Through-holes 23 are formed by etching toward polycrystalline-silicon layers 24 from the back of substrate 1, that is, the outer surface of the crystal unit to polycrystalline-silicon layers 24. A conductive layer for electrically connecting polycrystalline-silicon layer 24 is formed on the inner surface of each through-hole 23, which allows through-hole 23 to function as an electrode through-hole. On the outer surface of substrate 1, the conductive layer of each through-hole 23 is formed in such a way as to also spread toward the area peripheral to through-hole 23, constituting external terminal 6 as in the case of the first embodiment. Dummy external terminals 6 are also formed along the other short side of mounting substrate 1 where no through-holes are provided.

For example, a gold-plated layer (not shown) is provided on the top surface of polycrystalline-silicon layer 25. Crystal blank 2 is electrically and mechanically connected to mounting substrate 1 by opposite sides of one end thereof to which its excitation electrodes are extended being connected to the polycrystalline-silicon layers by bumps 25 through the gold-plated layers by means of ultrasonic thermo-compression bonding and thermo compression bonding.

Cover 3 is bonded to mounting substrate 1 according to the same procedure as that in the first embodiment using an anode bonding method. Here, detailed explanations of the anode bonding method will not be repeated.

Then, the method of manufacturing such a surface mount crystal unit will be explained particularly focused on the method of manufacturing mounting substrate 1.

Since mounting substrate 1 is made of silicon, it can be manufactured efficiently by applying so-called semiconductor device fabricating processes, forming multiple mounting substrates 1 on a single silicon wafer simultaneously and then separating them apart as individual mounting substrates.

First, on one principal surface of a silicon wafer (not shown), multiple polycrystalline-silicon layers are provided at the positions at which polycrystalline-silicon layers 24 in each mounting substrate 1 are formed. Then, a first mask layer is formed on the entire surface of one principal surface. On the other principal surface of the silicon wafer, a second mask layer provided with openings are formed according to the position at which through-holes 23 are formed. Therefore, each opening of the second mask layer is located below polycrystalline-silicon layer 24 on the first principal surface of mounting substrate 1. The first mask layer and second mask layer are formed of a material which is not dissolved in an aqueous solution of KOH (potassium hydroxide), for example, SiO$_2$ or SIN, etc.

Then, the silicon wafer on which such mask layers have been formed is immersed in an aqueous solution of KOH and etched. Since single-crystalline silicon is dissolved in the aqueous solution of KOH but polycrystalline-silicon is not dissolved, through-hole 23 is formed from each opening of the second mask layer to corresponding polycrystalline-silicon layer 24 on the first principal surface side. Then, in order to form a conductive layer on the inner surface of the through-holes and external terminals 6, a Cr layer. Cu layer and Au layer are formed one by one using a thin-film formation method such as vacuum deposition and sputtering. In this way, through-holes 23 which function as electrode through-holes and external terminals 6 are completed. Then, by dividing the silicon wafer into individual mounting substrates 1, multiple mounting substrates 1 are manufactured simultaneously. After the division into mounting substrates 1, crystal blank 2 is connected to mounting substrate 1 through bumps 25, then cover 3 is bonded to mounting substrate 1 through anode bonding according to the same procedure as that described in the first embodiment, and in this way the surface mount crystal unit is completed.

In this second embodiment, it is possible to use a large crystal blank for the same reason as that in the first embodiment, obtain a good vibration characteristic and improve the degree of freedom of design. Furthermore, it is possible to improve shock resistance and reliably prevent ambient air from entering the case. Especially in this embodiment, through-holes 23 are blocked by polycrystalline-silicon layers 24 provided on one principal surface of mounting substrate 1 made of silicon, which further assures airtightness.

Figure 9:
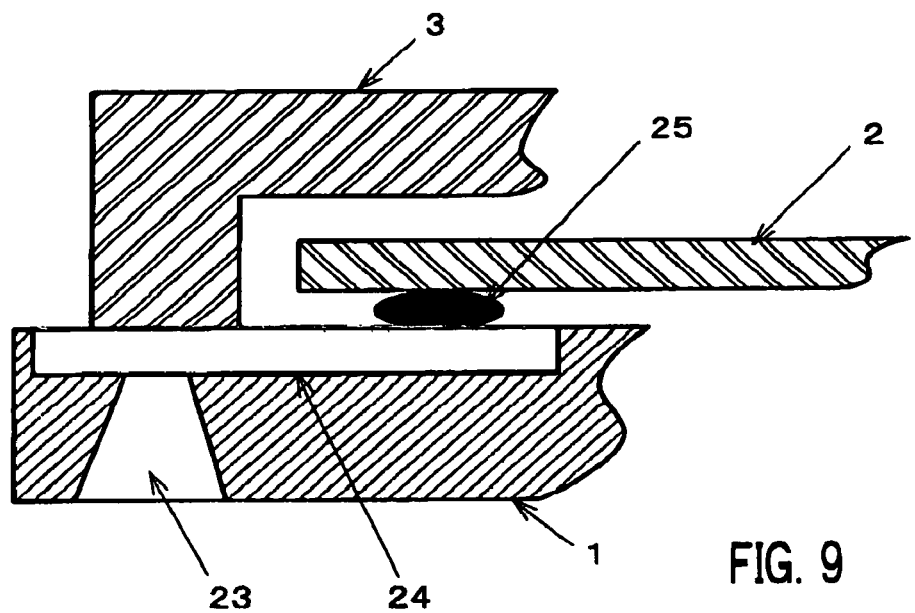
FIG. 9 is a partial sectional view showing another example of the surface mount crystal unit according to the second embodiment.

In the crystal unit in the above described second embodiment, the positions at which through-holes 23 are formed are not limited to the ones described above. Considering that polycrystalline-silicon is also subject to anode bonding, as shown in an enlarged view in FIG. 9, it is also possible to form through-holes 23 at the position at which cover 3 and mounting substrate 1 are bonded, provide polycrystalline-silicon layers 24 so as to extend from the position at which through-holes 23 is formed to the inside of the case and connect crystal blank 2 at the position at the end of poly-crystalline-silicon layers 24 through bump 25. Thus, providing through-holes 23 at the bonding positions of anode bonding can further assure airtightness.

Furthermore, the positions of mounting terminals 6 on the outer surface of mounting substrate 1 are not limited to the above described positions. It is possible to form polycrystalline-silicon layer 24 as a conductor path, form mounting terminals at both ends in the longitudinal direction of mounting substrate 1 or place mounting terminals at both ends of a pair of diagonal lines. It is also possible to extend the mounting terminal up to the end face of mounting substrate 1 if necessary.

Figure 10:
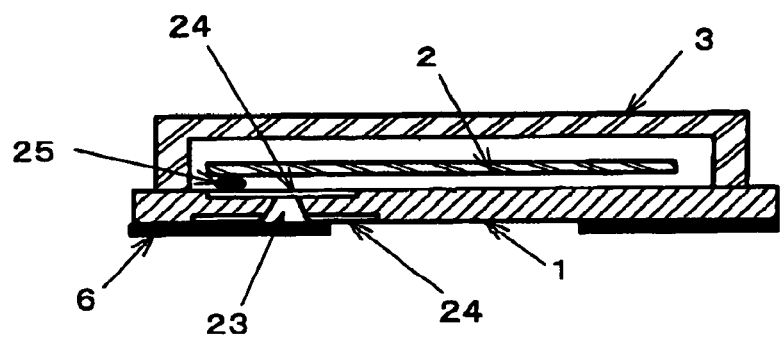
FIG. 10 is a sectional view showing a further example of the surface mount crystal unit according to the second embodiment.

FIG. 10 shows polycrystalline-silicon layer 24 also provided on the back of mounting substrate 1 to further assure the electrical connection between through-holes 23 as electrode through-holes and external terminals 6.

As the method of connecting crystal blank 2 to mounting substrate 1, it is possible to select from not only ultrasonic thermo-compression bonding or thermo-compression bonding using bumps but also a connection method through a eutectic alloy layer or a method using a conductive adhesive as appropriate.

The surface mount crystal unit according to the second embodiment can also be constructed as a surface mount crystal oscillator by incorporating an IC chip in the case. For example, as in the case of the one shown in FIG. 7, an IC chip can be placed on the surface of mounting substrate 1 below crystal blank 2.

Then, the third embodiment of the present invention will be explained. The surface mount crystal unit of the above described embodiments functions as a surface mount crystal oscillator by incorporating an IC chip in which an oscillation circuit using the crystal blank is integrated. In the example shown in FIG. 7, such an IC chip is placed in a space between the crystal blank and mounting substrate. However, since the IC chip uses a silicon semiconductor substrate per se, the mounting substrate made of silicon itself can be used as an IC chip. The mounting substrate provided with the function as an IC chip makes it possible to reduce the number of constituent elements, external dimensions, especially height in the surface mount crystal oscillator.

Figure 11A:
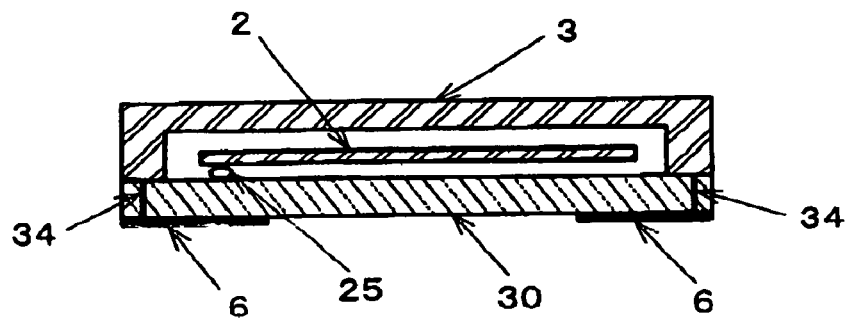
FIG. 11A is a sectional view showing a surface mount crystal oscillator according to a third embodiment of the present invention.
Figure 11B:
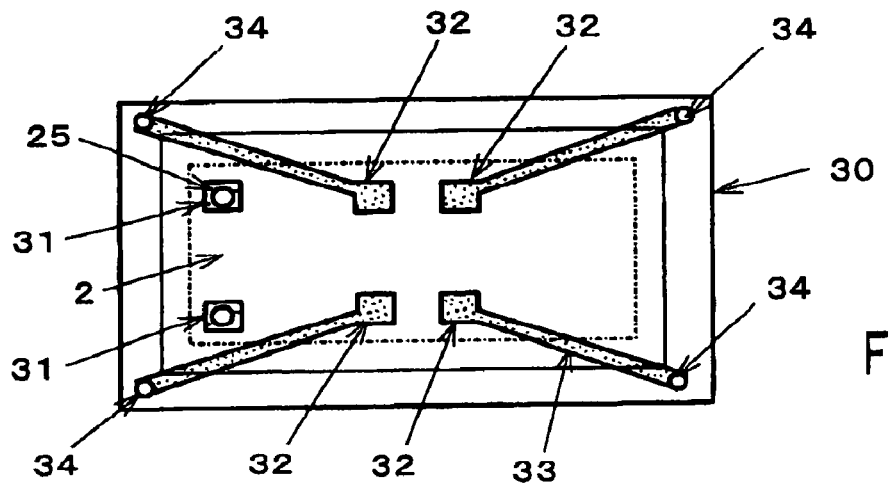
FIG. 11B is a plan view of the crystal oscillator shown in FIG. 11A with the cover removed.

The surface mount crystal oscillator according to the third embodiment shown in FIGS. 11A and 11B comprises crystal blank 2 hermetically sealed in a case made up of substantially square planar mounting substrate 30 and cover 3 having a shape with a recess. As crystal blank 2, the above-described one shown in FIG. 2 is used. As cover 3, the same one used in the first embodiment is used.

Mounting substrate 30 is a silicon semiconductor substrate and includes an integrated oscillation circuit using crystal blank 2 and functions as an IC chip. The integrated oscillation circuit is provided inside mounting substrate 30. On both sides of one end on the inner surface of mounting substrate 30, connection electrodes 31 used for a connection with crystal blank 2 are formed. Furthermore, in the central area of the inner surface of mounting substrate 30, IC terminals 32 are provided as a power terminal, output terminal and grounding terminal for the oscillation circuit. Of course, connection electrodes 31 and IC terminals 32 are electrically connected to the oscillation circuit integrated in mounting substrate 30. Suppose the oscillation circuit is provided in the central area of mounting substrate 30 and no circuit is provided in the peripheral area.

Both sides of one end of crystal blank 2 to which extension electrodes are drawn out are bonded to connection electrodes 32 by means of, for example, thermo-compression bonding or ultrasonic thermo-compression bonding using bumps 25. This allows crystal blank 2 to be held on mounting substrate 30 and electrically connected to the oscillation circuit in mounting substrate 30.

Each IC terminal 32 in mounting substrate 30 is drawn to each of the four corners of mounting substrate 30 through conductive path 33 formed on the inner surface of mounting substrate 30. External terminals 6 used to surface-mount this crystal oscillator on an external wiring board are provided in the four corners on the back, that is, the outer surface of mounting substrate 30. Then, in each of the four corners, external terminal 6 and conductive path 33 are electrically connected through electrode through-hole 34 or a via-hole provided so as to penetrate mounting substrate 30. Electrode through-holes 34 are formed by providing through-holes in mounting substrate 30 and providing an electrode layer in these through-holes by means of vapor deposition, etc.

In this embodiment, cover 3 is connected to the peripheral area of mounting substrate 30, that is, the area where no circuit is provided, by means of anode bonding. Here, the anode bonding is made so that electrode through-holes 34 are covered with the frame wall of cover 3. Since execution condition of the anode bonding is the same as that in the case of the first embodiment, detailed explanations thereof will not be repeated.

Since the surface mount crystal oscillator in this embodiment uses a silicon substrate on which an oscillation circuit is integrated as mounting substrate 30, there is no need for an independent IC chip compared to a conventional crystal oscillator which requires an IC chip in addition to the mounting substrate. It is therefore possible to reduce the number of components and further reduce the size as the crystal oscillator. Especially, it is possible to reduce the height of the crystal oscillator drastically. Furthermore, as in the case of the first and second embodiments, it is possible to obtain a good vibration characteristic and improve the degree of freedom of design, improve the shock resistance and reliably prevent ambient air from entering the case.

Figure 12A:
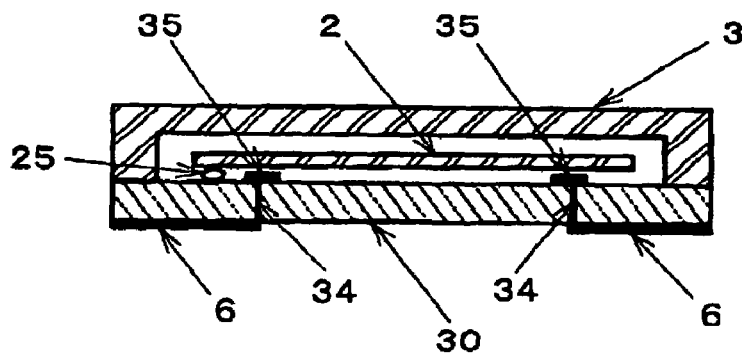
FIG. 12A is a sectional view showing another example of the surface mount crystal oscillator according to the third embodiment.
Figure 12B:
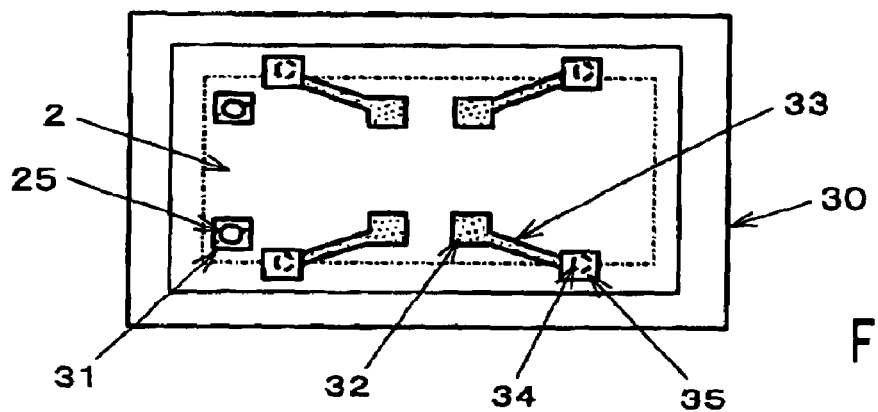
FIG. 12B is a plan view of the crystal oscillator shown in FIG. 12A with the cover removed.

In this embodiment, the positions of electrode through-holes 34 are not limited to those described above. In the crystal oscillator shown in FIGS. 12A and 12B, electrode through-holes 34 are provided at the positions which is positions inside cover 3 and in the area where no circuit of mounting substrate 30 is provided. In this case, in order to prevent ambient air or the like from entering the case through electrode through-holes 34, metal thin plates 35 are arranged over electrode through-holes 34 so that these metal thin plates 35 block electrode through-holes 34. Also in this configuration, external terminals 6 are electrically connected to IC terminals 32 through electrode through-holes 34 and conductive paths 33.

Figure 13A:
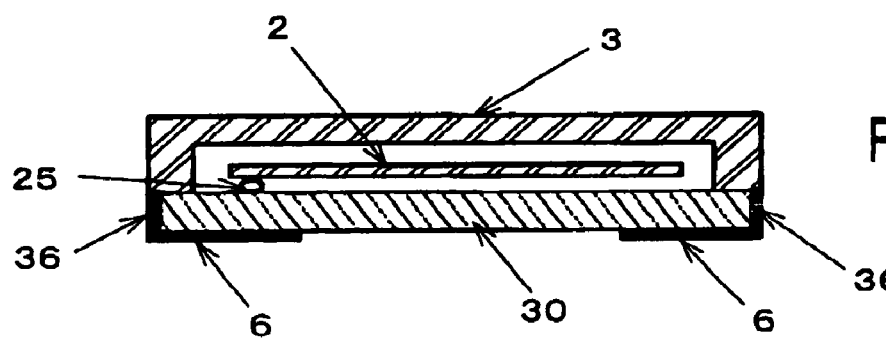
FIG. 13A is a sectional view showing a further example of the surface mount crystal oscillator according to the third embodiment.
Figure 13B:
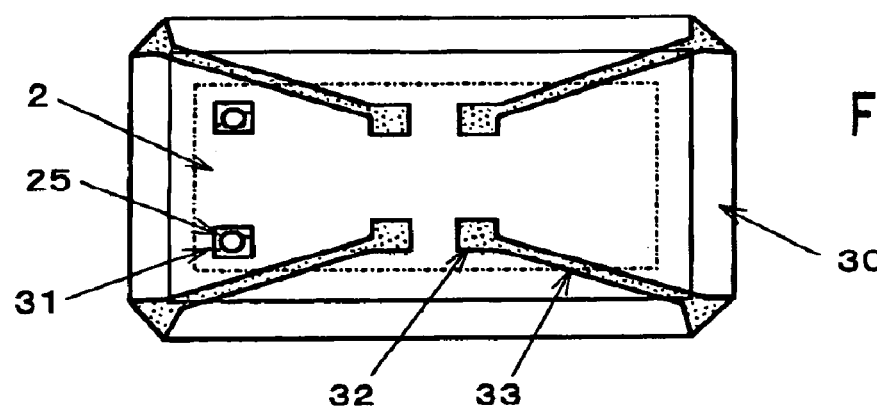
FIG. 13B is a plan view of the crystal oscillator shown in FIG. 13A with the cover removed.

The surface mount crystal oscillator shown in FIGS. 13 and 14 forms conductive path 33 drawn from IC terminal 32 as an aluminum wiring layer, draws conductive path 33 out of the case across the bonded surface between mounting substrate 30 and cover 3, leads it along end face electrode 36 formed on the end face of mounting substrate 30 and connects it to external terminal 6. In this case, since the conductive path which traverses the bonded surface of anode bonding is made up of an aluminum layer, airtightness is kept as explained in the first embodiment.

This embodiment is characterized by forming the case of the surface mount crystal oscillator through anode bonding between a planar mounting substrate made of silicon in which an oscillation circuit is integrated and a cover having a shape with a recess and made of glass containing high mobility ions. Therefore, the method of fixing a crystal blank and method of leading electrodes to the outside are not limited to the above described method.

Then, a fourth embodiment of the present invention will be explained using FIGS. 14A and 14B. The surface mount crystal oscillator shown in FIGS. 12A and 12B above forms electrode through-holes 34 in mounting substrate 30 at positions which are inside the case and further arranges metal thin plates 35 so as to block electrode through-holes 34. As in the case of the second embodiment, this fourth embodiment assures airtightness by providing a polycrystalline-silicon layer on the surface of mounting substrate 30.

Figure 14A:
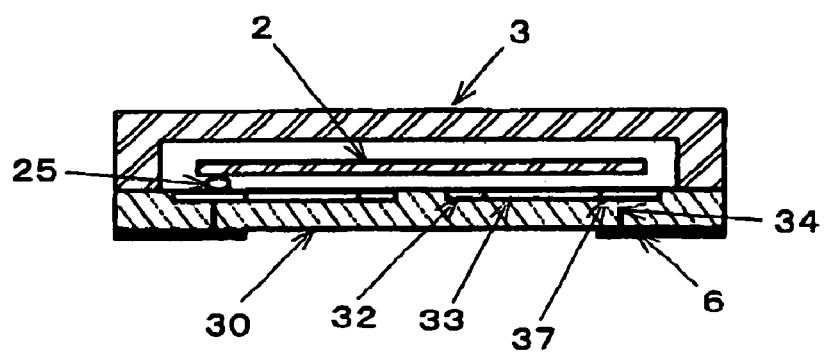
FIG. 14A is a sectional view showing a surface mount crystal oscillator according to a fourth embodiment of the present invention.
Figure 14B:
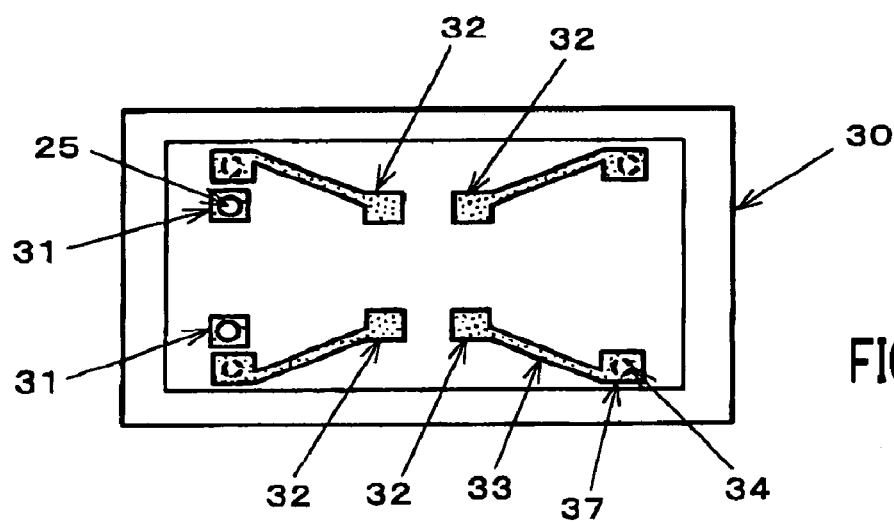
FIG. 14B is a plan view of the crystal oscillator shown in FIG. 14A with the cover and crystal blank removed.

The surface mount crystal oscillator according to the fourth embodiment shown in FIGS. 14A and 14B comprises of crystal blank 2 hermetically sealed in a case made up of substantially square planar mounting substrate 30 and cover 3 having a shape with a recessed part. As crystal blank 2, the above-described one shown in FIG. 2 is used. As cover 3, the same cover used in the first embodiment is used.

Mounting substrate 30 is a silicon semiconductor substrate and integrates an oscillation circuit using crystal blank 2 therein and also functions as an IC chip. On both sides of one end of the inner surface of mounting substrate 30, connection electrodes 31 used for a connection with crystal blank 2 are formed. Furthermore, in the central area of the inner surface of mounting substrate 30, IC terminals 32 are provided as a power terminal, output terminal and grounding terminal for the oscillation circuit. Connection electrodes 31 and IC terminals 32 are electrically connected to the oscillation circuit integrated in mounting substrate 30. Here, suppose the oscillation circuit is provided in the central area of mounting substrate 30 and no circuit is provided in the peripheral area.

The respective IC terminals 32 of mounting substrate 30 are drawn to conductive terminals 37 provided close to the four corners of mounting substrate 30 through conductive paths 33 formed on the inner surface of mounting substrate 30. External terminals 6 to be used to surface-mount this crystal oscillator on a wiring board are provided in the four corners on the outer surface of mounting substrate 30. Electrode through-holes 34 are provided on the undersides of conductive terminals 37 in such a way as to penetrate mounting substrate 30 and conductive terminals 37 and external terminals 6 are electrically connected by means of electrode through-holes 34.

In this embodiment, all connection electrodes 31, IC terminals 32, conductive paths 33 and conductive terminals 37 are formed of a polycrystalline-silicon layer provided on mounting substrate 30. On this polycrystalline-silicon layer, for example, high concentration boron is diffused.

Both sides of one end of crystal blank 2 to which the extension electrodes are drawn out are fixed to connection electrodes 32 by means of, for example, thermo-compression bonding or ultrasonic thermo-compression bonding using bumps 25. This allows crystal blank 2 to be held on mounting substrate 30 and electrically connected to the oscillation circuit in mounting substrate 30. Cover 3 is bonded to the area peripheral to mounting substrate 30, that is, the area where no circuit is provided, by means of anode bonding. Since the execution condition of the anode bonding is the same as that in the case of the first embodiment, detailed explanations thereof will not be repeated.

Then, the method of manufacturing such a surface mount crystal unit will be explained particularly focused on the method of manufacturing mounting substrate 30.

Since mounting substrate 30 is made of silicon, it can be manufactured efficiently by applying so-called semiconductor device fabricating processes, forming multiple mounting substrates 30 on a single silicon wafer simultaneously and then separating them apart as individual mounting substrates.

First, on one principal surface of a silicon wafer (not shown), multiple polycrystalline-silicon layers are provided in accordance with connection electrodes 31, IC terminals 32, conductive paths 33 and conductive terminals 37 of mounting substrate 30. Then, a first mask is formed on the entire surface of one principal surface. On the other principal surface of the silicon wafer, a second mask layer provided with an opening is formed according to each position at which through-holes 34 are formed. Therefore, the openings of the second mask layer are located below conductive terminals 37 on the first principal surface of mounting substrate 30. The first mask layer and second mask layer are formed of a material which is not dissolved in an aqueous solution of KOH (potassium hydroxide), for example, $SiO_2$ or SiN, etc.

Then, the silicon wafer on which such masks have been formed is immersed in an aqueous solution of KOH and etched. Since single-crystalline silicon is dissolved in the aqueous solution of KOH but polycrystalline-silicon is not dissolved, through-holes 34 are formed from the openings of the second mask layer to conductive terminals 37 on the first principal surface side of mounting substrate 30. Then, in order to form a conductive layer on the inner surfaces of the through-holes and external terminals 6, a Cr layer, Cu layer and Au layer are formed one by one using a thin-film formation method such as vacuum deposition and sputtering. In this way, electrode through-holes 34 and external terminals 6 are completed. Then, by dividing the silicon wafer into individual mounting substrates 30, multiple mounting substrates 30 are manufactured simultaneously. After the division into mounting substrates 30, crystal blank 2 is connected to mounting substrate 30 through bumps 25, then cover 3 is bonded to mounting substrate 30 through anode bonding according to the same procedure as that described in the first embodiment, and in this way the surface mount crystal oscillator is completed.

The surface mount crystal oscillator in this embodiment also uses a silicon substrate in which an oscillation circuit is integrated as a mounting substrate, and can thereby eliminate the need for an independent IC chip, reduce the number of parts and further reduce the size of a crystal oscillator. Especially, it can reduce the height of the crystal oscillator considerably. Furthermore, as in the case of the first and second embodiments, it can obtain a good vibration characteristic and improve the degree of freedom of design, improve shock resistance and reliably prevent ambient air from entering the case. Especially in this embodiment, electrode through-holes 34 are blocked by conductive terminals 37 made of polycrystalline-silicon, and therefore it is possible to further assure airtightness.

What is claimed is:

1. A surface mount crystal unit comprising:
    a crystal blank;
    a planar mounting substrate made of silicon; and
    a cover having a shape with a recessed part and made of glass containing ions having high mobility,
    wherein said mounting substrate and said cover are bonded by means of anode bonding,
    said crystal blank is hermetically sealed in a case made up of said mounting substrate and said cover, and
    said mounting substrate has connection electrodes used for a connection with said crystal blank.

2. The crystal unit according to claim 1, further comprising external terminals provided on an outer surface of said mounting substrate,
    wherein said connection electrodes are made of a metal body, electrode through-holes which penetrate said mounting substrate are provided below said metal body and said external terminals and said connection electrodes are electrically connected by means of said electrode through-holes.

3. The crystal unit according to claim 1, further comprising:

external terminals provided on an outer surface of said mounting substrate; and conductive paths made of aluminum arranged on a surface of said mounting substrate and traversing a bonded surface through said anode bonding, wherein said connection electrodes and said external terminals are electrically connected by means of said conductive paths.

4. The crystal unit according to claim 1, wherein said connection electrodes are made up of a polycrystalline silicon layer provided on a surface of said mounting substrate, electrode through-holes which penetrate said mounting substrate are provided below said connection electrodes and said external terminals and said connection electrodes are electrically connected by means of said electrode through-holes.

5. The crystal unit according to claim 4, wherein said crystal blank is electrically connected with said connection electrodes through bumps.

6. The crystal unit according to claim 1, wherein said ions having high mobility are $Na^+$ ions or $Li^+$ ions.

7. A surface mount crystal oscillator comprising:
a crystal blank;
a planar mounting substrate made of silicon in which an oscillation circuit using said crystal blank is integrated; and
a cover having a shape with a recess and made of glass containing ions having high mobility,
wherein said mounting substrate and said cover are bonded by means of anode bonding and said crystal blank is hermetically sealed in a case made up of said mounting substrate and said cover.

8. The crystal oscillator according to claim 7, wherein connection electrodes used for an electrical connection with said crystal blank and IC terminals including at least a power terminal, output terminal and grounding terminal are provided on one surface of said mounting substrate, external terminals for external mounting are provided on the other surface of said mounting substrate, and said IC terminals and said external terminals are electrically connected through electrode through-holes provided on said mounting substrate.

9. The crystal oscillator according to claim 8, wherein said electrode through-holes are provided in accordance with bonding positions of said anode bonding, whereby one end thereof is closed.

10. The crystal oscillator according to claim 8, further comprising:
metal bodies provided on one surface of said mounting substrate; and
conductive paths which connect said IC terminals and said conductive terminals,
wherein said electrode through-holes are blocked by said metal bodies.

11. The crystal oscillator according to claim 7, wherein connection electrodes used for an electrical connection with said crystal blank and IC terminals including at least a power terminal, output terminal and grounding terminal of said oscillation circuit are provided on one surface of said mounting substrate, external terminals for external mounting are provided on the other surface of said mounting substrate, conductive paths made of aluminum which traverse a bonded surface by said anode bonding are provided on the surface of said mounting substrate, and said IC terminals and said external terminals are electrically connected by said conductive paths.

12. The crystal oscillator according to claim 8, wherein said electrode through-holes are blocked by a Polycrystalline-silicon layer provided on a surface of said mounting substrate.

13. The crystal oscillator according to claim 12, wherein said IC terminals and said connection electrodes are formed of polycrystalline-silicon.

14. The crystal oscillator according to claim 13, wherein said crystal blank is electrically connected with said connection electrodes through bumps.

15. The crystal oscillator according to claim 7, wherein said ions having high mobility are $Na^+$ ions or $Li^+$ ions.

* * * * *